(12) United States Patent
Shih

(10) Patent No.: US 12,156,380 B2
(45) Date of Patent: Nov. 26, 2024

(54) HOUSING STRUCTURE

(71) Applicants: Inventec (Pudong) Technology Corporation, Shanghai (CN); INVENTEC CORPORATION, Taipei (TW)

(72) Inventor: Ming Hung Shih, Taipei (TW)

(73) Assignees: Inventec (Pudong) Technology Corporation, Shanghai (CN); INVENTEC CORPORATION, Taipei (TW)

(*) Notice: Subject to any disclaimer, the term of this patent is extended or adjusted under 35 U.S.C. 154(b) by 232 days.

(21) Appl. No.: 17/931,543

(22) Filed: Sep. 12, 2022

(65) Prior Publication Data

US 2023/0292471 A1  Sep. 14, 2023

(30) Foreign Application Priority Data

Mar. 8, 2022 (CN) .......................... 202210220681.7

(51) Int. Cl.
*H05K 7/20* (2006.01)
*H05K 5/06* (2006.01)

(52) U.S. Cl.
CPC ......... *H05K 7/20409* (2013.01); *H05K 5/061* (2013.01); *H05K 7/20709* (2013.01)

(58) Field of Classification Search
CPC . H05K 7/20409; H05K 7/061; H05K 7/20709
USPC .......................................... 165/80.3, 104.33
See application file for complete search history.

(56) References Cited

U.S. PATENT DOCUMENTS

2021/0068311 A1* 3/2021 Zhong .................. H05K 7/1431
2021/0404748 A1* 12/2021 Bassett .................... F25D 11/00

FOREIGN PATENT DOCUMENTS

CN       108323046 A      7/2018
JP       2019-91884 A     6/2019

* cited by examiner

*Primary Examiner* — Joel M Attey
(74) *Attorney, Agent, or Firm* — CKC & Partners Co., LLC

(57) ABSTRACT

A housing structure includes a first cover and a second cover. The first cover includes a first substrate and two first side plates. The second cover includes a second substrate and two second side plates. The two first side plates and the two second side plates are spliced between the first substrate and the second substrate, such that an accommodating space is formed between the first cover and the second cover.

6 Claims, 7 Drawing Sheets

HOUSING STRUCTURE

CROSS-REFERENCE TO RELATED APPLICATION

This application claims priority to China Application Serial Number 202210220681.7, filed Mar. 8, 2022, which is herein incorporated by reference in its entirety.

BACKGROUND

Field of Invention

The present disclosure relates to a housing structure, especially a heat dissipation housing structure.

Description of Related Art

In the industry of heat dissipation chassis, there are currently few chassis designs for outdoor artificial intelligence (AI) server boxes. In particular, chassis designs especially designed for high ambient temperatures and high heat dissipation requirements are rare among competitors on the market today. The most common chassis design is one where the AI server is accommodated between two chassis.

However, because an accommodating space for accommodating electronic components between the two chasses is a must, there must be side plates surrounded on four sides between the two chassis to cover the electronic components. In order to cope with the large demand for AI-related hardware in the future, manufacturers must minimize the processing time and cost. In addition, the artificial intelligence server boxes need to be installed outdoors, so the designed chassis must be adaptable to changing weather conditions or outdoor environments.

Therefore, how to propose a housing structure for accommodating electronic components and achieving the effect of reducing processing costs and responding to changes in outdoor weather is one of the problems that the industry urgently wants to invest in research and development resources to solve.

SUMMARY

In view of this, one purpose of present disclosure is to provide a housing structure that can solve the aforementioned problems.

In order to achieve the above objective, according to one embodiment of the present disclosure, a housing structure includes a first cover and a second cover. The first cover includes a first substrate and two first side plates. The first substrate includes a first inner surface and a first outer surface. The two first side plates are connected to the first substrate and respectively adjacent to two opposite edges of the first inner surface. The first substrate and the two first side plates extend along a first axial direction. The second cover includes a second substrate and two second side plates. The second substrate includes a second inner surface and a second outer surface. The two second side plates are connected to the second substrate and respectively adjacent to two opposite edges of the second inner surface. The second substrate and the two second side plates extend along a second axial direction. The two first side plates and the two second side plates are spliced between the first substrate and the second substrate, such that an accommodating space is formed between the first cover and the second cover.

In one or more embodiments of the present disclosure, the first axial direction is perpendicular to the second axial direction.

In one or more embodiments of the present disclosure, the first cover further includes a plurality of first heat dissipation fins connected to the first outer surface.

In one or more embodiments of the present disclosure, the first cover further includes two first extending portions connected to the first substrate and adjacent to the two opposite edges of the first outer surface respectively, and the two first extending portions and the first heat dissipation fins extend in the first axial direction.

In one or more embodiments of the present disclosure, a thickness of each of the two first extending portions is greater than a thickness of each of the first heat dissipation fins.

In one or more embodiments of the present disclosure, the second cover further includes a plurality of second heat dissipation fins connected to the second outer surface.

In one or more embodiments of the present disclosure, the second cover further includes two second extending portions connected to the second substrate and adjacent to the two opposite edges of the second outer surface respectively, and the two second extending portions and the second heat dissipation fins extend in the second axial direction.

In one or more embodiments of the present disclosure, a thickness of each of the two second extending portions is greater than a thickness of each of the second heat dissipation fins.

In one or more embodiments of the present disclosure, the housing structure further includes a waterproof element connected between the first cover and the second cover.

In one or more embodiments of the present disclosure, the waterproof element has a first circular abutting surface and a second circular abutting surface opposite to each other, and the first circular abutting surface continuously abuts against the first inner surface and a surface of each of the two first side plates away from the first inner surface, the second circular abutting surface continuously abuts against the second inner surface and a surface of each of the two second side plates away from the second inner surface, so that the waterproof element air-tightly abutted between the first cover and the second cover.

In summary, in the housing structure of the present disclosure, since the first cover and the second cover are combined with each other in different directions, the two first side plates and the two second side plates are spliced between the first substrate and the second substrate to form an accommodating space for accommodating electronic components without adding additional components increasing processing time and cost. In the housing structure of the present disclosure, since the housing structure includes the waterproof element, the housing structure can achieve the waterproof effect under weather conditions such as rainy days. In the housing structure of the present disclosure, since the first heat dissipation fins and the second heat dissipation fins extend in different directions, the housing structure can be adaptable to changes in the wind direction, so as to achieve a sufficient heat dissipation effect in an outdoor environment.

The aforementioned description is only used to explain the problem to be solved by the present disclosure, the technical means to solve the problem, and the effects produced, etc. The specific details of the present disclosure will be well discussed in the following embodiments and related drawings.

BRIEF DESCRIPTION OF THE DRAWINGS

In order to make the above and other objectives, features, advantages and examples of the present disclosure more obvious, the description of the accompanying drawings is as follows.

DETAILED DESCRIPTION

Figure 1:
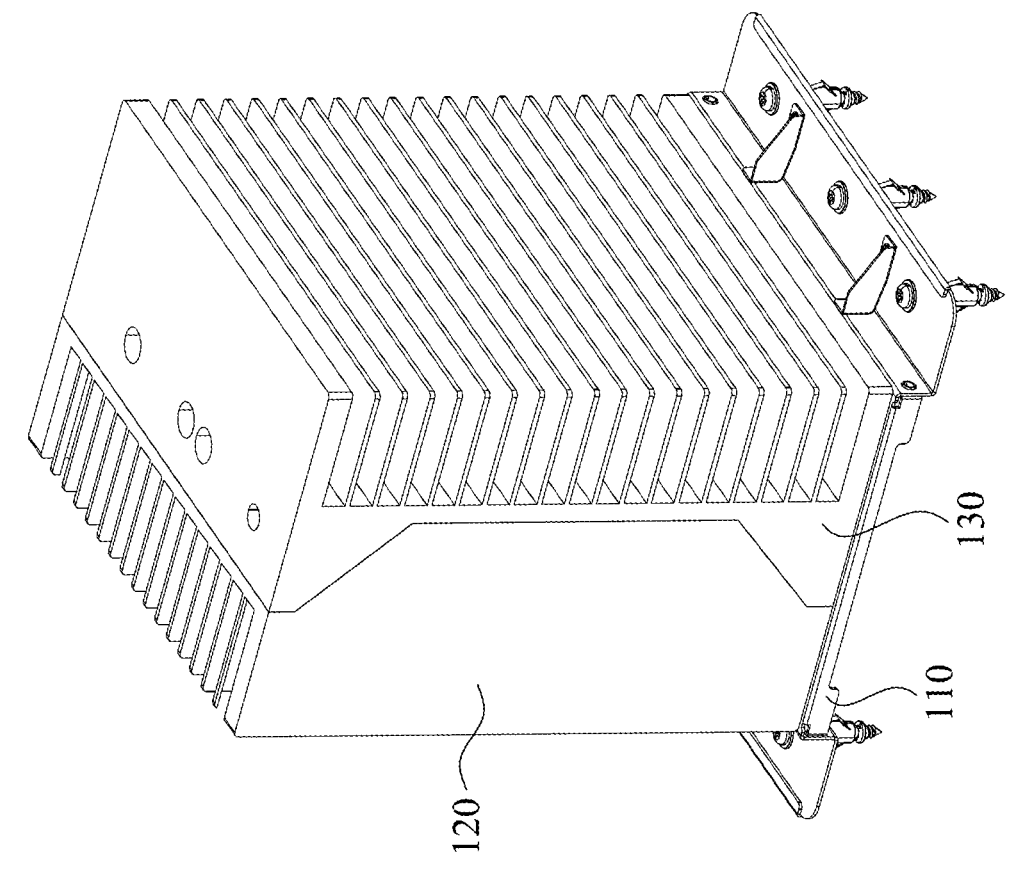
FIG. 1 shows a schematic view of a housing structure according to an embodiment of the present disclosure.

Hereinafter, a plurality of embodiments of the present disclosure will be disclosed in diagrams. For clarity of discussion, many details in practice will be described in the following description. However, it should be understood that these details in practice should not limit present disclosure. In other words, in some embodiments of present disclosure, these details in practice are unnecessary. In addition, for simplicity of the drawings, some conventionally used structures and elements will be shown in a simple schematic manner in the drawings. The same reference numbers are used in the drawings and the description to refer to the same or like parts.

Hereinafter, the structure and function of each component included in a housing structure 100 of this embodiment and the connection relationship between the components will be described in detail.

Reference is made to FIG. 1. FIG. 1 is a schematic view of a housing structure 100 according to an embodiment of the present disclosure. In this embodiment, the housing structure 100 includes a base 110, a first cover 120, and a second cover 130. The first cover 120 is combined with the second cover 130, and both the first cover 120 and the second cover 130 are connected to the base 110. In some embodiments, as shown in FIG. 1, the base 110 is connected to a side of the first cover 120 and a side of the second cover 130.

In some embodiments, the first cover 120 and the base 110 are combined with each other by means such as locking, but the present disclosure is not intended to limit the method and means of combining the first cover 120 and the base 110 with each other.

In some embodiments, the second cover 130 and the base 110 are combined with each other by means such as locking, but the present disclosure is not intended to limit the method and means of combining the second cover 130 and the base 110 with each other.

In some embodiments, the first cover 120 and the second cover 130 are combined with each other by means such as locking, but the present disclosure is not intended to limit the method and means of combining the first cover 120 and the second cover 130 with each other.

Figure 2:
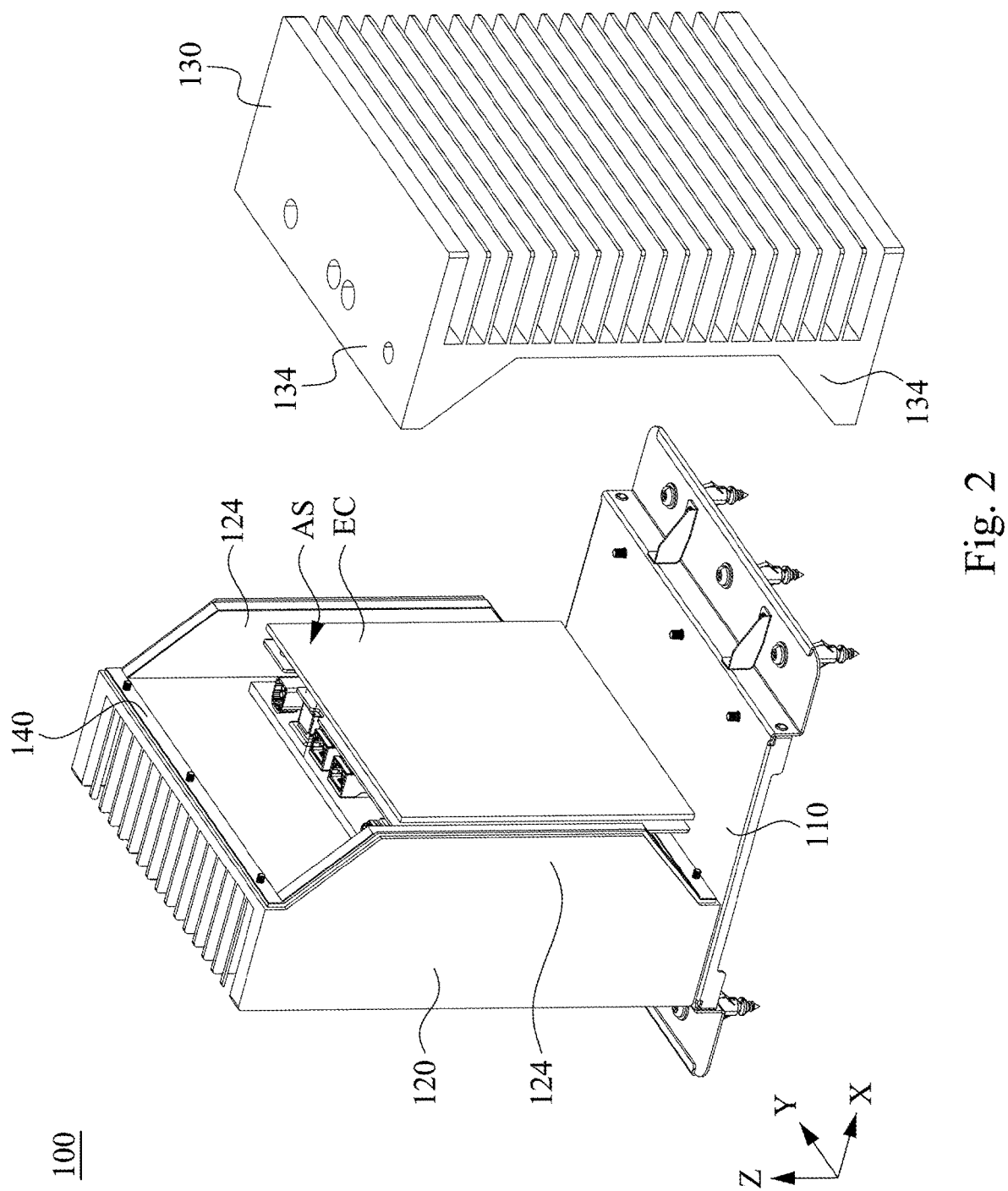
FIG. 2 shows an exploded view of the housing structure according to an embodiment of the present disclosure.

Reference is made to FIG. 2. FIG. 2 is an exploded view of the housing structure 100 according to an embodiment of the present disclosure. In FIG. 2, the second cover 130 is shown away from the base 110 and the first cover 120 to more clearly illustrate the structure, function and connection relationship between the elements included in the housing structure 100. In this embodiment, an accommodating space AS is between the first cover 120 and the second cover 130. The accommodating space AS accommodates an electronic component EC. In this embodiment, the housing structure 100 further includes a waterproof element 140. The waterproof element 140 is disposed between the first cover 120 and the second cover 130. For simplicity, the waterproof element 140 in FIG. 2 is shown as being located on the first cover 120, but the waterproof element 140 is actually connected between the first cover 120 and the second cover 130 without being exposed (as shown in FIG. 1).

In some embodiments, the electronic component EC may be a communication module such as a server. For example, the electronic component EC may be an artificial intelligence computing server. The above is merely an example for simple description, and the present disclosure is not intended to limit the type of the electronic component EC.

In some embodiments, as shown in FIG. 2, the waterproof element 140 is circular in shape. More specifically, the waterproof element 140 includes two opposite circular abutting surfaces, so that the waterproof element 140 air-tightly abuts between the first cover 120 and the second cover 130.

Next, the structure, function and connection relationship between the elements included in the first cover 120 and the second cover 130 will be described in detail.

Figure 3:
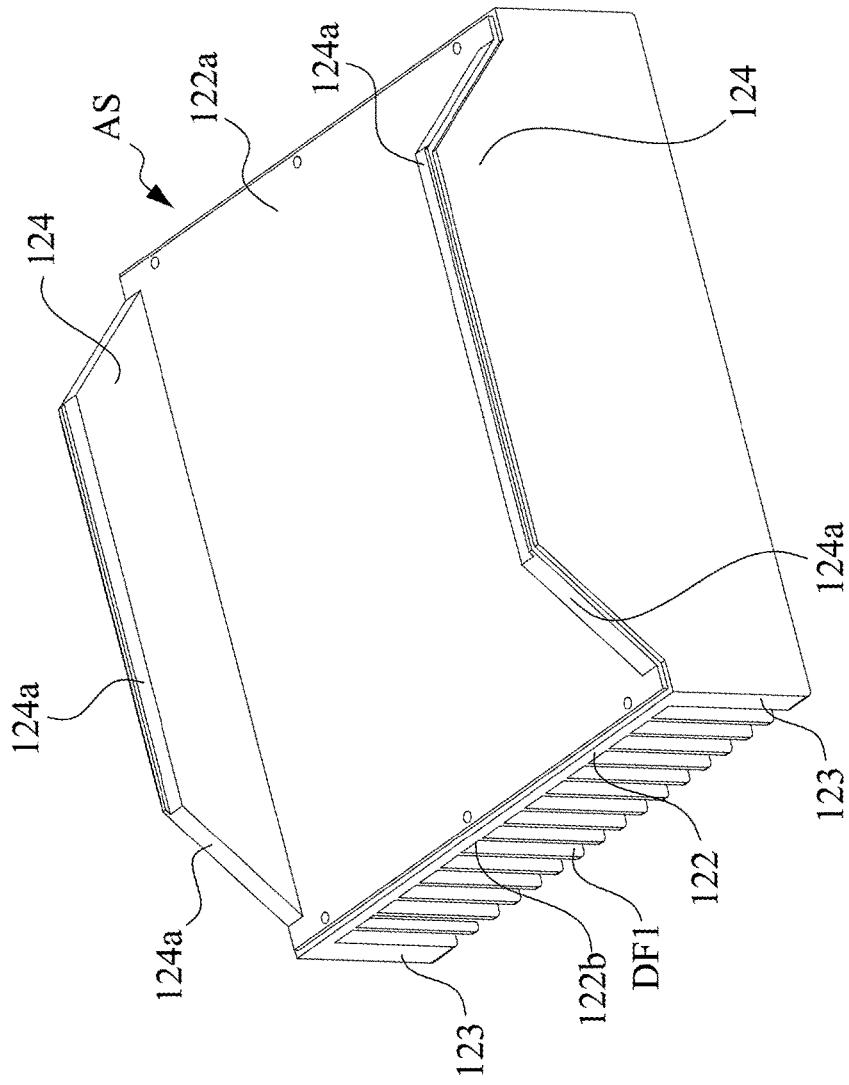
FIG. 3 shows a schematic view of a first cover according to an embodiment of the present disclosure.

Reference is made to FIG. 3. FIG. 3 is a schematic view of the first cover 120 according to an embodiment of the present disclosure. In this embodiment, the first cover 120 includes a first substrate 122, two first extending portions 123, and two first side plates 124. The first substrate 122 has a first inner surface 122a and a first outer surface 122b. The two first extending portions 123 are connected to the first substrate 122, and the two first extending portions 123 are respectively adjacent to two opposite edges of the first outer surface 122b. As shown in FIG. 3, the first substrate 122 and the two first extending portions 123 extend along a first axial direction (for example, z-direction in FIG. 3), but the present disclosure is not limited thereto. The two first side plates 124 are connected to the first substrate 122, and the two first side plates 124 are adjacent to two opposite edges of the first inner surface 122a, respectively. As shown in FIG. 3, the two first extending portions 123 and the two first side plates 124 extend along the first axial direction (for example, z-direction in FIG. 3), but the present disclosure is not limited thereto.

In some embodiments, the first cover 120 further includes a plurality of first heat dissipation fins DF1. The first heat dissipation fins DF1 are connected to the first outer surface 122b of the first substrate 122. As shown in FIG. 3, the two first extending portions 123 and the first heat dissipation fins DF1 are connected to the first outer surface 122b and extend along the first axial direction (for example, z-direction in FIG. 3), but the present disclosure is not limited thereto.

Figure 4:
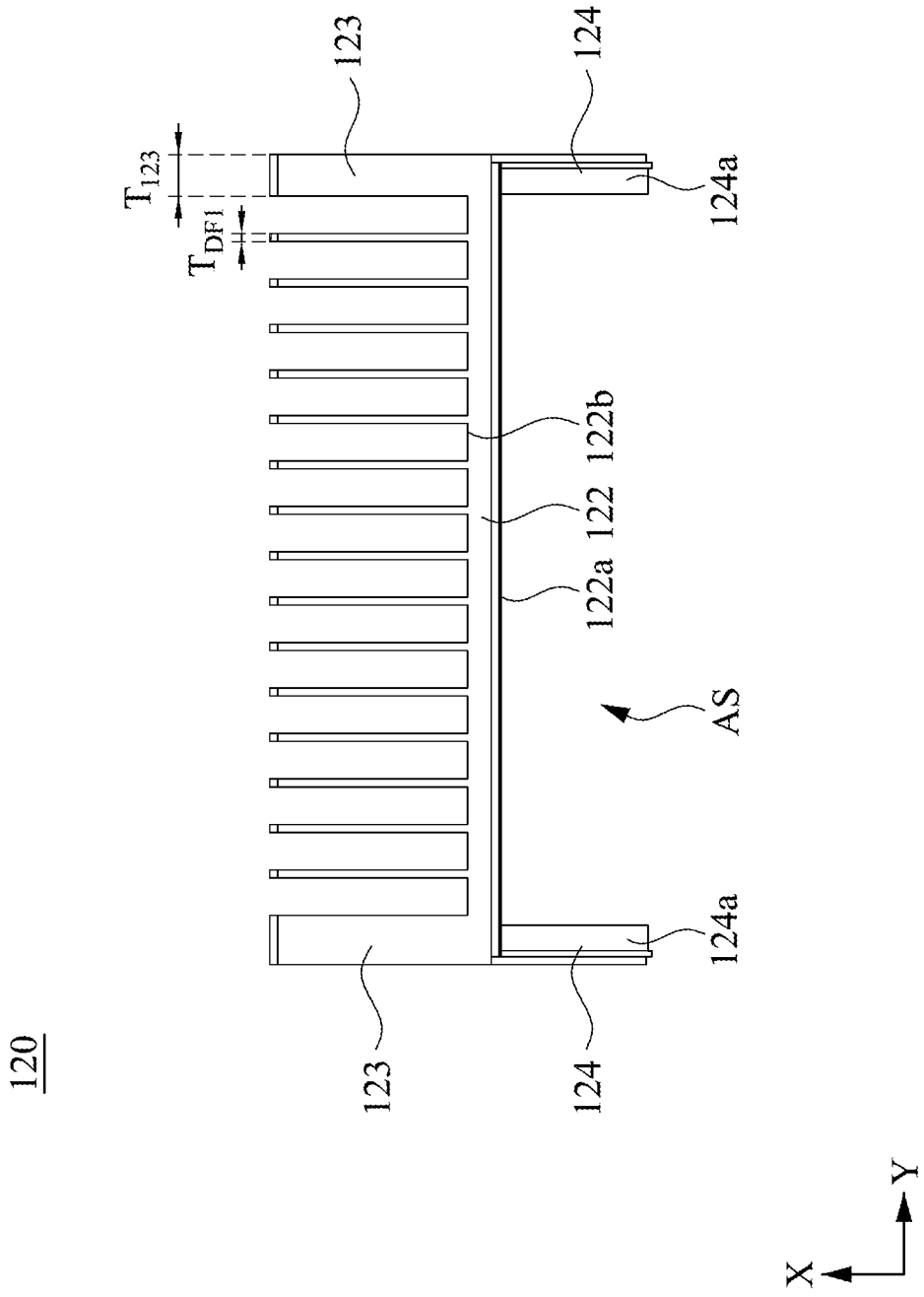
FIG. 4 shows a side view of the first cover according to an embodiment of the present disclosure.

Reference is made to FIG. 4. FIG. 4 is a side view of the first cover 120 according to an embodiment of the present disclosure. In this embodiment, the first extending portion 123 has a thickness T123, and the first heat dissipation fin DF1 has a thickness TDF1. In some embodiments, as shown in FIG. 4, the thickness T123 of the first extending portion 123 is substantially greater than the thickness TDF1 of the first heat dissipation fin DF1.

In some embodiments in which the thickness T123 of the first extending portion 123 is greater than the thickness TDF1 of the first heat dissipation fin DF1, since the first extending portion 123 is thicker than the first heat dissipation fin DF1, and the first heat dissipation fin DF1 is located between the two first extending portions 123, so that the two first extending portions 123 can protect the first heat dissipation fins DF1, so as to prevent the first heat dissipation fins DF1 from being damaged by external force, and then affects the heat dissipation efficiency of the electronic component EC. In some embodiments in which the thickness T123 of the first extending portion 123 is greater than the thickness TDF1 of the first heat dissipation fin DF1, since the first heat dissipation fin DF1 is thinner than the first extending portion 123, so that the quantity of the first heat dissipation fins DF1 arranged between the two first extending portions 123 can be increased, thereby increasing the contact area with the air, so as to enhance the heat dissipation efficiency of the electronic component EC.

In some embodiments, the thickness T123 of the first extending portion 123 is substantially greater than the thickness TDF1 of the first heat dissipation fin DF1, but the present disclosure is not intended to limit the size between the thickness T123 of the first extending portion 123 and the thickness TDF1 of the first heat dissipation fin DF1.

In some embodiments, the first cover 120 is formed by at least an extrusion process. For example, the cross-section of the mold (not shown) in the extrusion process may be the shape shown in FIG. 4. An operator can extrude a material such as metal into the aforementioned mold to extrude the first cover 120 having the cross-section shown in FIG. 4. Accordingly, the first substrate 122, the two first extending portions 123, the two first side plates 124, and the first heat dissipation fins DF1 of the first cover 120 extend along the first axial direction (for example, z-direction).

In some embodiments, the cutting process may be performed after performing the aforementioned extrusion process. For example, as shown in FIG. 3, after the metal material entering the aforementioned mold is extruded to produce a strip-shaped product, the first cover 120 having the two first side plates 124 can be formed by post-processing of the cutting process. More specifically, as shown in FIG. 3, each of the two first side plates 124 has a surface 124a, and both sides of the surface 124a have inclined surfaces inclined with respect to the first inner surface 122a. The inclined surfaces may be formed by performing the aforementioned cutting process.

Figure 5:
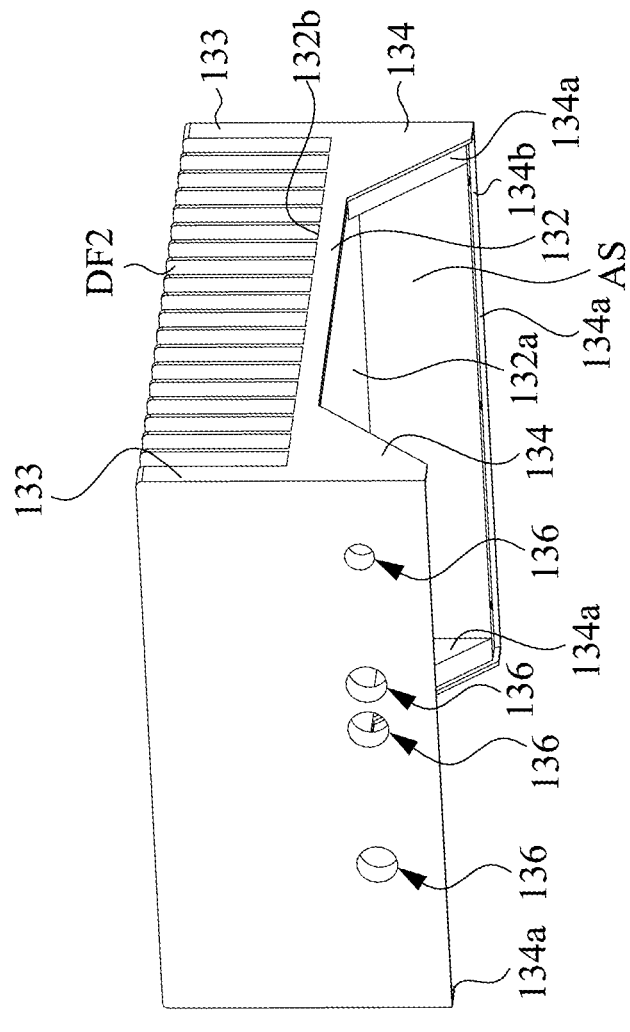
FIG. 5 shows a schematic view of a second cover according to an embodiment of the present disclosure.

Reference is made to FIG. 5. FIG. 5 is a schematic view of the second cover 130 according to an embodiment of the present disclosure. In this embodiment, the second cover 130 includes a second substrate 132, two second extending portions 133, and two second side plates 134. The second substrate 132 has a second inner surface 132a and a second outer surface 132b. The two second extending portions 133 are connected to the second substrate 132, and the two second extending portions 133 are respectively adjacent to two opposite edges of the second outer surface 132b. As shown in FIG. 5, the second substrate 132 and the two second extending portions 133 extend along a second axial direction (for example, y-direction in FIG. 5), but the present disclosure is not limited thereto. The two second side plates 134 are connected to the second substrate 132, and the two second side plates 134 are respectively adjacent to two opposite edges of the second inner surface 132a. As shown in FIG. 5, the two second extending portions 133 and the two second side plates 134 extend along the second axial direction (for example, y-direction in FIG. 5), but the present disclosure is not limited thereto.

In some embodiments, the second cover 130 further includes a plurality of second heat dissipation fins DF2. The second heat dissipation fins DF2 are connected to the second outer surface 132b of the second substrate 132. As shown in FIG. 5, the two second extending portions 133 and the second heat dissipation fins DF2 are connected to the second outer surface 132b and extend along the second axial direction (for example, y-direction in FIG. 5), but the present disclosure is not limited thereto.

In some embodiments, one of the two second side plates 134 has a plurality of openings 136. The openings 136 penetrate through the second side plates 134. The openings 136 are configured to allow wires such as network wires and power wires in the electronic component EC. In some embodiments, as shown in FIG. 5, the quantity of the openings 136 is four, but the present disclosure is not limited thereto.

Figure 6:
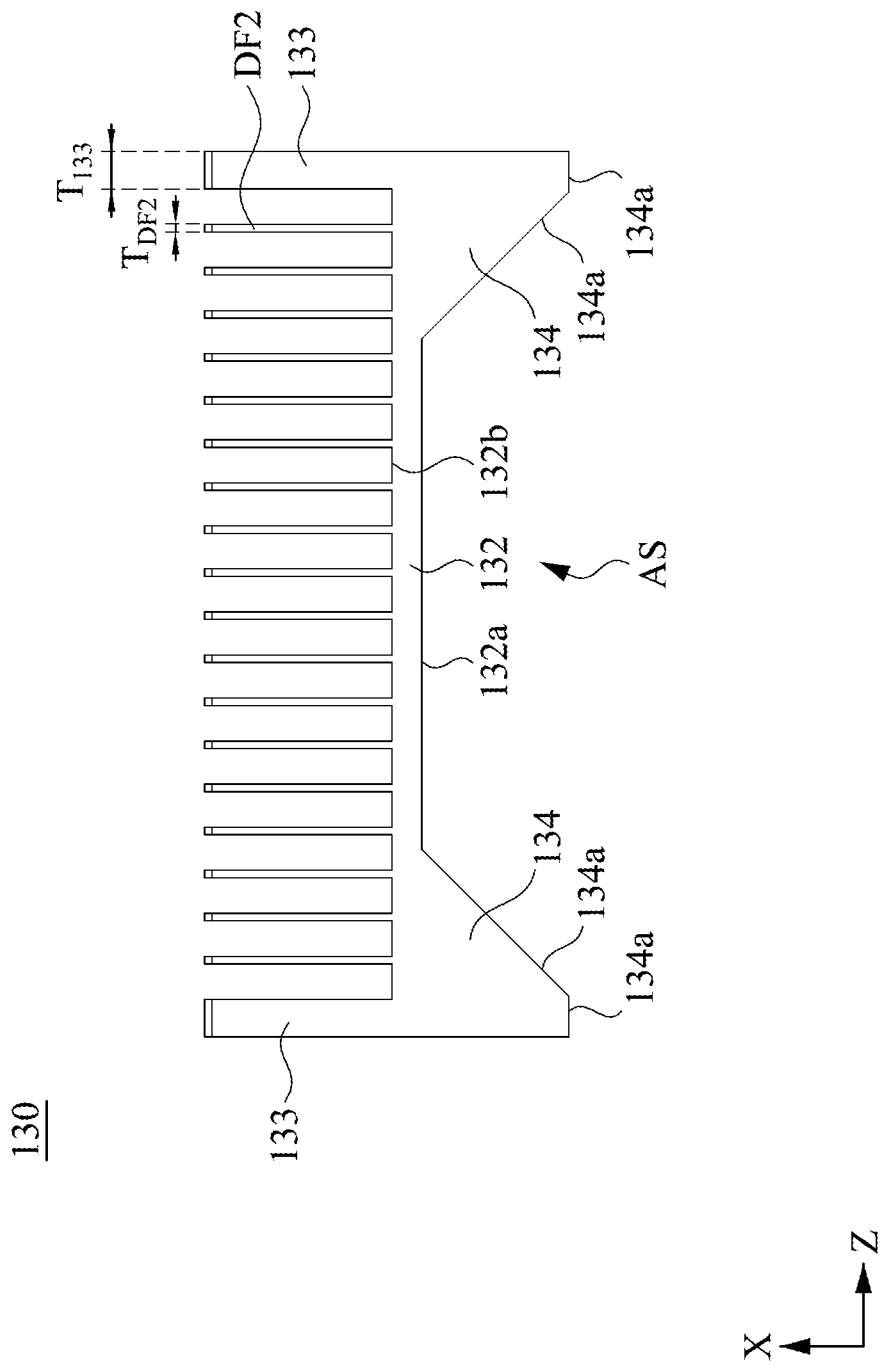
FIG. 6 shows a side view of the second cover according to an embodiment of the present disclosure.

Reference is made to FIG. 6. FIG. 6 is a cross-sectional view of the second cover 130 according to an embodiment of the present disclosure. In this embodiment, the second extending portion 133 has a thickness T133, and the second heat dissipation fin DF2 has a thickness TDF2. In some embodiments, as shown in FIG. 6, the thickness T133 of the second extending portion 133 is substantially greater than the thickness TDF2 of the second heat dissipation fin DF2.

In some embodiments in which the thickness T133 of the second extending portion 133 is greater than the thickness TDF2 of the second heat dissipation fin DF2, since the second extending portion 133 is thicker than the second heat dissipation fin DF2, and the second heat dissipation fin DF2 is located between the two second extending portions 133, so that the two second extending portions 133 can protect the second heat dissipation fins DF2, so as to prevent the second heat dissipation fins DF2 from being damaged by external force, and then affects the heat dissipation efficiency of the electronic component EC. In some embodiments in which the thickness T133 of the second extending portion 133 is greater than the thickness TDF2 of the second heat dissipation fin DF2, since the second heat dissipation fin DF2 is thinner than the second extending portion 133, so that the quantity of the second heat dissipation fins DF2 arranged between the two second extending portions 133 can be increased, thereby increasing the contact area with the air, so as to enhance the heat dissipation efficiency of the electronic component EC.

In some embodiments, the thickness T133 of the second extending portion 133 is substantially greater than the thickness TDF2 of the second heat dissipation fin DF2, but the present disclosure is not intended to limit the size between the thickness T133 of the second extending portion 133 and The thickness TDF2 of the second heat dissipation fin of DF2.

In some embodiments, the second cover 130 is formed by at least an extrusion process. For example, the cross-section of the mold (not shown) in the extrusion process may be the shape shown in FIG. 6. The operator can extrude a material such as metal into the aforementioned mold to extrude the second cover 130 having the cross-section shown in FIG. 6. Accordingly, the second substrate 132, the two second extending portions 133, the two second side plates 134, and the second heat dissipation fins DF2 of the second cover 130 extend along the second axial direction (for example, y-direction).

In some embodiments, a chemical milling process, for example, may be performed after performing the aforementioned extrusion process. For example, as shown in FIG. 5, after the metal material entering the aforementioned mold is extruded to produce a strip-shaped product, a part of the metal material can be corroded by the post-processing of the chemical milling process to form the second cover 130 having the two second side plates 134. More specifically, as shown in FIG. 5, after the second cover 130 undergoing the aforementioned extrusion process, the shape of the second side plates 134 will be similar to the shape of a triangular column. After the post-processing of the chemical milling process, each portion of the two triangular-shaped second side plates 134 will be corroded by chemicals to form an accommodating space AS having a substantially rectangular parallelepiped shape inside the second cover 130.

It should be noted that the aforementioned methods for forming the first cover 120 and the second cover 130 are merely examples for simple description, and the methods for forming the first cover 120 and the second cover 130 in the present disclosure are actually not limited to extrusion process, cutting process, and chemical milling process. The first cover 120 and the second cover 130 of the present disclosure may be formed by any suitable method.

In some embodiments, the aforementioned first axial direction is perpendicular to the second axial direction, but the present disclosure is not limited thereto. For example, the extending direction of the first heat dissipation fins DF1 is perpendicular to the extending direction of the second heat dissipation fins DF2. It is advantageous that the extending direction of the first heat dissipation fins DF1 is perpendicular to the extending direction of the second heat dissipation fins DF2. Since the housing structure 100 is disposed in an outdoor environment, the first heat dissipation fins DF1 and the second heat dissipation fins DF2 with different extending directions enable the housing structure 100 to adapt to the changing wind direction, so as to achieve a good heat dissipation effect. Accordingly, the housing structure 100 of the present disclosure is more suitable for a usage in an outdoor environment.

Figure 7:
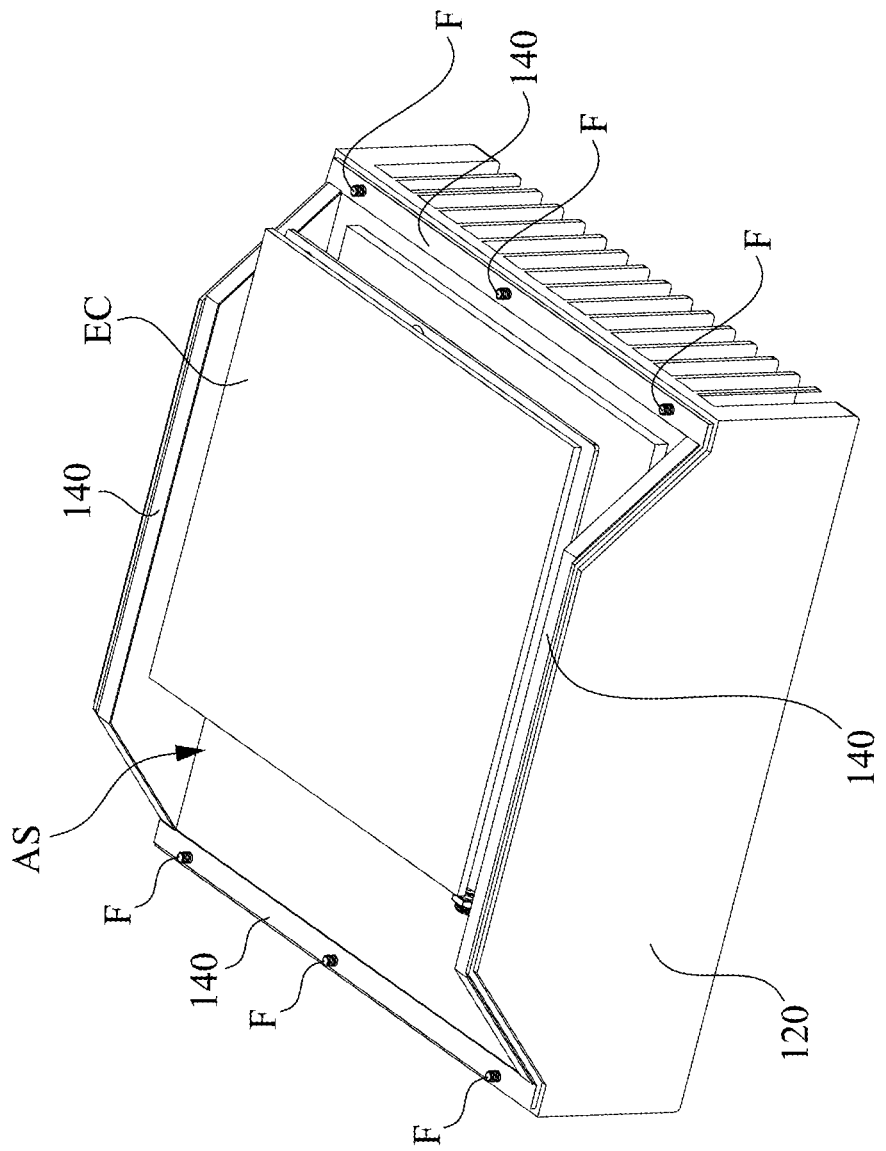
FIG. 7 shows a schematic view of a waterproof element, the first cover and an electronic component accommodated in an accommodating space according to an embodiment of the present disclosure.

Reference is made to FIG. 7. FIG. 7 is a schematic view of the waterproof element 140, the first cover 120, and the electronic component EC accommodated in the accommodating space AS. In some embodiments, the waterproof element 140 is formed between the first cover 120 and the second cover 130 by coating. For example, the operator can first coat the liquid waterproof material on the first cover 120. More specifically, as shown in FIG. 7, the aforementioned waterproof material may be coated on two opposite edges of the first inner surface 122a and a surface 124a of the two first side plates 124 away from the first inner surface 122a. Accordingly, the aforementioned waterproof material is circularly distributed inside the first cover 120. After the aforementioned waterproof material is air-dried and solidified, a circular waterproof element 140 is formed (as shown in FIG. 7). After the waterproof element 140 is formed on the first cover 120, the operator then combines the second cover 130 toward the first cover 120 and makes an circular abutting surface of the waterproof element 140 abut against the second inner surface 132a and a surface 134a of each of the two second side plates 134 away from the second inner surface 132a continuously to form the housing structure 100.

Alternatively, in some embodiments, the operator may also apply a liquid waterproof material on the second cover 130 first. More specifically, the aforementioned waterproof material may be coated on two opposite edges of the second inner surface 132a and a surface 134a of the two second side plates 134 away from the second inner surface 132a. Accordingly, the aforementioned waterproof material is circularly distributed inside the second cover 130. After the aforementioned waterproof material is air-dried and solidified, the circular waterproof element 140 is formed. After the waterproof element 140 is formed on the second cover 130, the operator then combines the first cover 120 toward the second cover 130 and makes the other circular abutting surface of the waterproof element 140 abut against the first inner surface 122a and a surface 124a of the two first side plates 124 away from the first inner surface 122a continuously to form the housing structure 100.

In some embodiments, as shown in FIG. 7, the first cover 120 and the second cover 130 are combined with each other by several fixing components F. More specifically, the first cover 120 and the second cover 130 are locked to each other by several fixing components F, so that the waterproof element 140 can be more air-tightly connected between the first cover 120 and the second cover 130.

In some embodiments, the fixing component F may be a locking screw, but the present disclosure is not limited thereto.

In some embodiments, since the inner side of the first cover 120 or the second cover 130 has a inclined surface (as shown in FIG. 3 to FIG. 6), the aforementioned waterproof material is coated on the first cover 120 or the second cover 130 can be more easily integrally formed.

In some embodiments, the waterproof element 140 may be a waterproof rubber. The present disclosure is not intended to limit the type of waterproof material of the waterproof element 140.

In some embodiments, a material of the first cover 120 and the second cover 130 may be a metal material such as aluminum, but the present disclosure is not limited thereto. In some embodiments, the material of the first cover 120 and the second cover 130 may be an aluminum alloy material such as AL6063, but the present disclosure is not limited thereto.

With the aforementioned configuration, the two first side plates 124 and the two second side plates 134 are spliced between the first substrate 122 and the second substrate 132, so that the accommodating space AS is formed between the first cover 120 and the second cover 130 to accommodate the electronic component EC. Since a circular abutting surface of the waterproof element 140 abuts against the first inner surface 122a and the surface 124a of the two first side plates 124 away from the first inner surface 122a, the other circular abutting surface abuts against the first inner surface 122a and the surface 124a of the two first side plates 124 away from the first inner surface 122a continuously, so that the waterproof element 140 can be air-tightly abutted between the first cover 120 and the second cover 130.

From the above detailed description of the specific embodiments of the present disclosure, it can be clearly seen that in the housing structure of the present disclosure, since the first cover and the second cover are combined with each other in different directions, the two first side plates and the two second side plates are spliced between the first substrate and the second substrate to form an accommodating space for accommodating electronic components without adding additional components increasing processing time and cost. In the housing structure of the present disclosure, since the housing structure includes the waterproof element, the housing structure can achieve the waterproof effect under weather conditions such as rainy days. In the housing structure of the present disclosure, since the first heat dissipation fins and the second heat dissipation fins extend in different directions, the housing structure can be adaptable to changes in the wind direction, so as to achieve a sufficient heat dissipation effect in an outdoor environment.

In an embodiment of the present disclosure, the housing structure of the present disclosure can be applied to a server, which can be used for artificial intelligence (AI) computing, edge computing, or used as a 5G server, cloud server or vehicle networking server.

Although the present disclosure has been disclosed as above in the embodiment manner, it does not intended to limit the present disclosure. Those skilled in the art can make various changes and modifications without departing from the spirit and scope of the present disclosure. Therefore, the scope of the present disclosure shall be subject to the scope of the attached claims.

What is claimed is:

1. A housing structure, comprising:
a first cover including a first substrate and two first side plates, and the first substrate includes a first inner surface and a first outer surface, wherein the two first side plates are connected to the first substrate and respectively adjacent to two opposite edges of the first inner surface, and the first substrate and the two first side plates extend along a first axial direction; and
a second cover including a second substrate and two second side plates, and the second substrate has a second inner surface and a second outer surface, wherein the two second side plates are connected to the second substrate and respectively adjacent to two opposite edges of the second inner surface, and the second substrate and the two second side plates extend along a second axial direction,
wherein the two first side plates and the two second side plates are spliced between the first substrate and the second substrate, such that an accommodating space is formed between the first cover and the second cover,
wherein the second cover further comprises a plurality of second heat dissipation fins connected to the second outer surface,
wherein the second cover further comprises two second extending portions connected to the second substrate and adjacent to the two opposite edges of the second outer surface respectively, and the two second extending portions and the second heat dissipation fins extend in the second axial direction.

2. The housing structure of claim 1, wherein the first axial direction is perpendicular to the second axial direction.

3. The housing structure of claim 1, wherein the first cover further comprises a plurality of first heat dissipation fins connected to the first outer surface.

4. The housing structure of claim 3, wherein the first cover further comprises two first extending portions connected to the first substrate and adjacent to the two opposite edges of the first outer surface respectively, and the two first extending portions and the first heat dissipation fins extend in the first axial direction.

5. The housing structure of claim 4, wherein a thickness of each of the two first extending portions is greater than a thickness of each of the first heat dissipation fins.

6. The housing structure of claim 1, wherein a thickness of each of the two second extending portions is greater than a thickness of each of the second heat dissipation fins.

* * * * *